United States Patent
Hardegger et al.

(10) Patent No.: US 9,250,123 B2
(45) Date of Patent: Feb. 2, 2016

(54) METHOD FOR ASSEMBLING A CIRCUIT CARRIER WITH A HOUSING COMPONENT, AND OPTICAL UNIT

(71) Applicant: CEDES SAFETY & AUTOMATION AG, Landquart (CH)

(72) Inventors: Martin Hardegger, Sargans (CH); Henry Schulze, Tartar (DE)

(73) Assignee: Rockwell Automation Safely AG (CH)

( * ) Notice: Subject to any disclaimer, the term of this patent is extended or adjusted under 35 U.S.C. 154(b) by 60 days.

(21) Appl. No.: 14/287,390

(22) Filed: May 27, 2014

(65) Prior Publication Data

US 2014/0346318 A1 Nov. 27, 2014

(30) Foreign Application Priority Data

May 27, 2013 (EP) ..................................... 13169321

(51) Int. Cl.
| | |
|---|---|
| *H01L 33/00* | (2010.01) |
| *G01J 1/42* | (2006.01) |
| *G01B 11/00* | (2006.01) |
| *H05K 13/00* | (2006.01) |
| *H01L 33/60* | (2010.01) |
| *H01L 33/48* | (2010.01) |
| *H05K 3/30* | (2006.01) |

(52) U.S. Cl.
CPC . *G01J 1/42* (2013.01); *G01B 11/00* (2013.01); *H01L 33/60* (2013.01); *H05K 13/0015* (2013.01); *H01L 33/486* (2013.01); *H01L 2933/0033* (2013.01); *H05K 3/303* (2013.01); *Y10T 29/49769* (2015.01); *Y10T 29/49826* (2015.01)

(58) Field of Classification Search
CPC ..................... Y10T 29/49826; H05K 13/0015; H05K 3/303; H01L 2933/0033
See application file for complete search history.

(56) References Cited

U.S. PATENT DOCUMENTS

| | | | |
|---|---|---|---|
| 4,404,741 A | 9/1983 | Lebet | |
| 4,651,203 A | 3/1987 | Peterson | |
| 8,957,448 B2 * | 2/2015 | Suh ....................... | H01L 33/486 257/100 |
| 2002/0001984 A1 | 1/2002 | Franzen | |
| 2009/0147498 A1 | 6/2009 | Park | |
| 2010/0067240 A1 | 3/2010 | Selverian | |

FOREIGN PATENT DOCUMENTS

| | | |
|---|---|---|
| EP | 2159853 A2 | 3/2010 |
| EP | 2660629 A1 | 11/2013 |
| EP | 2660644 A1 | 11/2013 |

OTHER PUBLICATIONS

European Extended Search Report Dated Dec. 5, 2013; Application No. 13169321.0—(11) Pages.

* cited by examiner

*Primary Examiner* — Tony Ko
(74) *Attorney, Agent, or Firm* — Boyle Fredrickson, S.C.

(57) ABSTRACT

The present invention relates to a method for assembling a circuit carrier with a housing component and furthermore to an optical unit for emitting and/or receiving radiation that is fabricated using this particular method of assembling and aligning the circuit carrier with the housing component. The method comprises the following steps: providing said circuit carrier, wherein on said circuit carrier there is arranged at least one electronic component, and providing said housing component having at least one first opening; aligning said circuit carrier in a way that said electronic component is aligned with respect to said first opening in the housing component, wherein the electronic component is directly used as a fiducial for its own position on the circuit carrier; fixing the circuit carrier at the housing component.

17 Claims, 6 Drawing Sheets

METHOD FOR ASSEMBLING A CIRCUIT CARRIER WITH A HOUSING COMPONENT, AND OPTICAL UNIT

CROSS-REFERENCE TO RELATED APPLICATIONS

This application claims priority to European Patent Application No. 13 169 321.0, filed May 27, 2013, the entire content of which is incorporated herein by reference.

BACKGROUND OF THE INVENTION

The subject matter disclosed herein relates generally to a method for assembling a circuit carrier with a housing component and, more specifically, to an optical unit for emitting and/or receiving radiation that is fabricated using this particular method of assembling and aligning the circuit carrier with the housing component.

When assembling electronic components, they are usually mounted on some sort of circuit carrier, and the circuit carrier has to be mounted at or within a mechanical part that forms a housing or is a part thereof. In a plurality of application fields, for instance when assembling optoelectronic components, such as light emitting diodes (LED) or light receiving components, such as photo diodes, a particularly accurate positioning of the electronic component with respect to the housing or another mechanical or optical part, for example, lenses and apertures, or an opening of the housing, has to be achieved. Usually, this alignment is either done by means of some mechanical fitting or by providing a fiducial on a printed circuit board (PCB) which is optically evaluated by means of an automatic assembly device. The fiducial is for instance formed by a structure, like a cross, a circle, or the like, provided in the metallization layer of the circuit carrier. The alignment of the PCB within the housing is then achieved by means of mechanical positioning aids, for example, openings. Hence, the tolerances of two alignment steps have to be taken into account.

However, in particular for optoelectronic applications, there is still a need of providing an improved alignment method that leads to a higher accuracy of the positioning between the housing component and the electronic component and furthermore can be performed in a more cost-effective and simple way.

BRIEF DESCRIPTION OF THE INVENTION

The subject matter disclosed herein describes an improved method for aligning optoelectronic devices that leads to a higher accuracy of positioning between the housing component and the electronic component. The method achieves an improved alignment between an opening in the housing component and the electronic component assembled on a circuit carrier by using the electronic component itself as an indicator for its position. Thus, the electronic component by itself has the functionality of a fiducial and its position is evaluated with respect to an opening in the housing component. This solution has a first advantage that no intermediate structures are used, where the intermediate structures introduce further tolerances and inaccuracies into the alignment process. Further, the production process is simplified because no additional fiducials or mechanical alignment structures have to be provided in addition to the assembled electronic component.

Apart from an opening, also a peripheral region of the housing component or a transparent region can be used for aligning the housing component with the mounted electronic component.

After the alignment step, the circuit carrier and the housing components are connected to each other mechanically for maintaining the aligned position.

According to one embodiment of the invention, a camera may be used to align the circuit carrier via an optical evaluation, wherein the position of the electronic component is monitored by taking images of the electronic component through the first opening or another mechanical reference, and to evaluate these images digitally for reaching an accurate position of the two components with respect to each other. For example, for optical systems without an aperture, the chip on the circuit carrier is aligned with respect to an optical axis of a lens.

According to another aspect of the invention, parts of the housing may be aligned with circuit carriers that have optoelectronic components mounted thereon. Such optoelectronic components can be light-emitting diodes (LEDs) or photodiodes for receiving radiation, but also time-of-flight elements used for safety and monitoring applications.

The circuit carrier may be affixed to the housing components via a laser welding step. To this end, the printed, circuit board can be provided with a second opening that allows the laser beam being directed to the housing component. If the housing component comprises a respective weldable material at the position of the second opening, same is melted by means of the laser beam and establishes a connection to the circuit carrier.

As an alternative or additionally, a hot stamping procedure can be performed. Furthermore, any other suitable method of fixing the two parts at each other, like gluing or overmolding, can also be used.

The desired alignment between an optoelectronic component mounted on the circuit carrier and an opening provided in a housing component is demonstrated when the opening is an optically functional aperture which is intended to shape either an incident or an emitted radiation beam during the operation of the optoelectronic component. For instance, in the application field of light curtains and light barriers, often radiation beams with a small opening angle are required. To this end, apertures with a defined diameter are arranged in front of the light emitting elements for reducing the opening angle. Similarly, an aperture arranged in front of the receiving element can be advantageous to filter out any noise radiation. In any case, the aperture is located with respect to an optical axis of the optical component.

The present invention is advantageous for electronic components that are mounted by means of a chip-on-board (COB) technique. However, the invention can also be used with surface mounted device (SMD) components. Moreover, when directly using the chip position of a light emitting diode (LED) within its SMD housing for the alignment, the inaccuracies of the position of the LED chip within the SMD housing can be reduced or eliminated by using the alignment technique according to the present invention. As the tolerance of an LED chip within an SMD housing is larger, the effect of the inventive alignment is even higher than for COB components.

To facilitate rapid dissipation of heat generated during the process and, furthermore, to keep the thermal expansion as low as possible, so-called metal core printed circuit boards (MCPCBs) can be used as the circuit carrier. The MCPCB usually comprises an aluminum alloy which is covered by an electrically insulating outer layer. The principles of the present invention, however, can of course also be used with any other sort of circuit carrier, such as ceramic circuit carriers or printed circuit boards.

In order to establish a predefined distance between the housing element and the circuit carrier, one or more distancing elements can be provided at the circuit carrier. This can, for instance, be an insert molding which covers a part of the surface of the printed circuit board.

According to one embodiment of the invention, the alignment is performed using a movable XY actuator connected to a video processing unit that takes and processes images of the electronic component through the opening or along a peripheral area of the housing component.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION OF THE PREFERRED EMBODIMENTS

Figure 1:
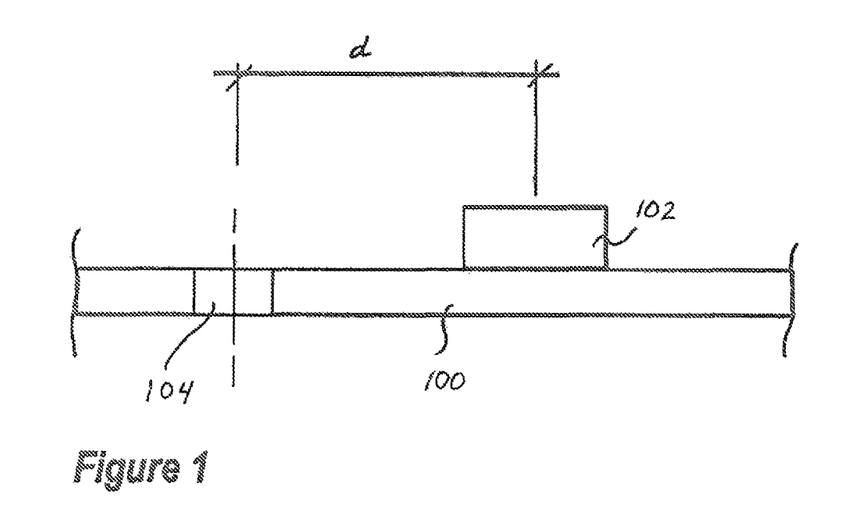
FIG. 1 is a schematic representation of a portion of a circuit carrier.

Turning initially to FIG. 1, the circuit carrier 100 carries an electronic component 102 which is connected to respective interconnection leads provided on the circuit carrier by means of a chip-on-board (COB) technique. The chip-on-board technique implies that the die itself is directly mounted on a circuit carrier, such as a printed circuit board, 100 without providing any further housing around the electronic component 102. This is a very common method of mounting, for instance LED dies. The circuit carrier 100 according to the present invention may for instance be formed by a metal core PCB (MCPCB) which has a core comprising an aluminum alloy. As already mentioned, other types of circuit carriers may also be used for the mounting procedure according to the present invention.

However, as already mentioned above, also standard LED chips in SMD housings can advantageously be assembled using an alignment according to the present invention.

A characteristic feature of the COB technique is that the positioning of the electronic component 102 on the printed circuit board itself is very accurate in respect to other parts of the circuit carrier 100. For instance, the distance, d, of the electronic component 102 in respect to the center of a bore hole 104 which can for instance be used for engaging with a tool that moves the PCB during the alignment procedure, can be aligned with a tolerance of ±50 µm or less.

The alignment of a circuit carrier 100 with respect to a part of a housing 106 will be explained in detail with respect to FIGS. 2 to 5.

Figure 2:
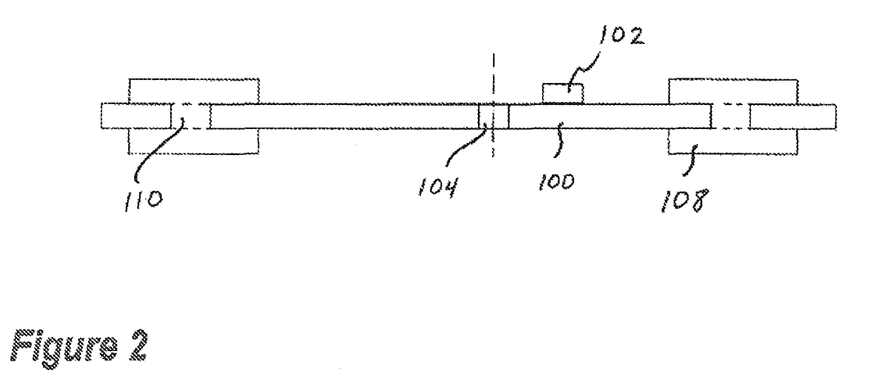
FIG. 2 is a schematic representation of a circuit carrier according to a first embodiment.
Figure 3:
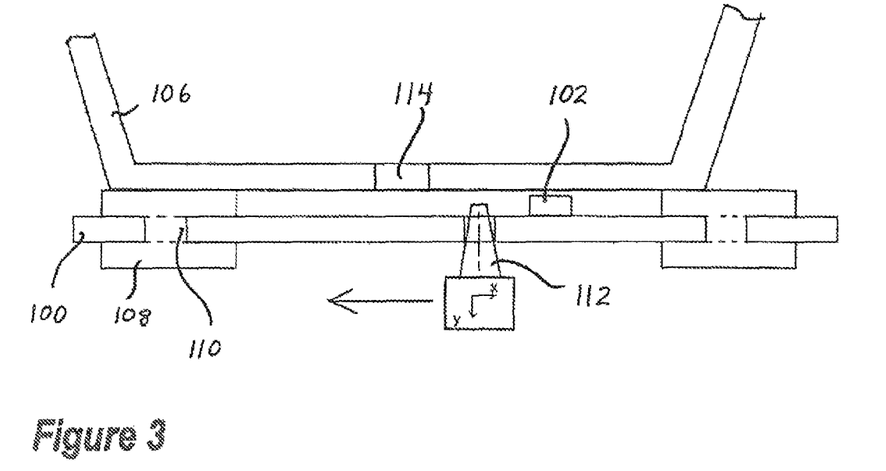
FIG. 3 shows a first step of an alignment procedure according to one embodiment of the present invention.

In the shown embodiment, the circuit carrier 100 has an electronic component 102 and an engaging opening 104, where a robot for moving the circuit carrier 100 can engage. Distancing elements 108 are provided by overmolding a printed circuit board, for instance a metal core printed circuit board, MCPCB. For a subsequent welding process, the PCB 100 has openings 110. For the alignment process, the circuit carrier 100 is brought into vicinity of the housing component 106. A tool 112, which allows for a precise movement of the circuit carrier 100 in at least X and Y direction, engages with the opening 104 provided at the circuit carrier 100.

Figure 4:
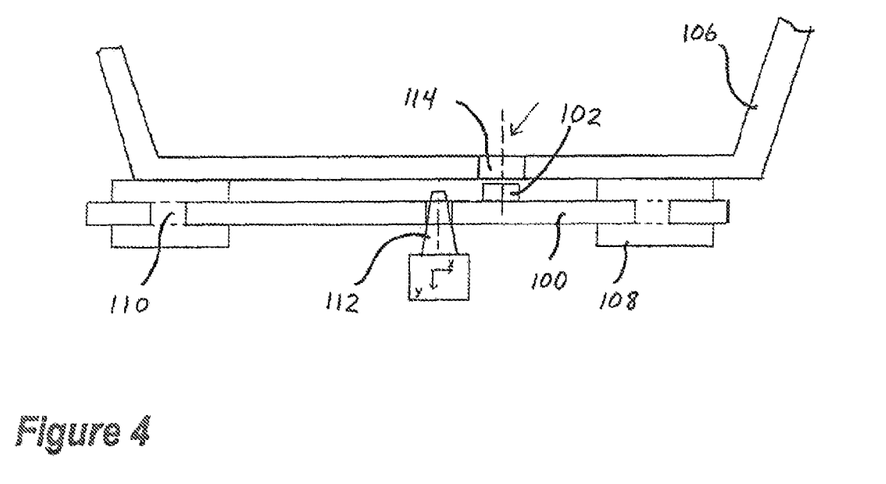
FIG. 4 illustrates a subsequent step of the alignment procedure of FIG. 3.

The housing component has an aperture 114, which is to be aligned with a position of the electronic component 102. By means of an actuator on the tool 112, the position of the circuit carrier 100 is changed with respect to the housing component 106 until the electronic component 102 can be imaged directly within the aperture 114. The distancing elements 108 maintain a predefined distance between the electronic component 102 and the housing component 106.

Instead of the aperture 114, also a transparent part such as a lens can be present, and the electronic component, e.g. an LED, is aligned with respect to the transparent part.

An optical alignment system views the electronic component 102 from above and ensures the perfect alignment of the two components in respect to each other. After the alignment has been finished, a next step is the final fixing of the circuit carrier 100 with respect to the housing component 106. According to one embodiment of the present embodiment, this is done by means of a laser welding step.

Figure 5:
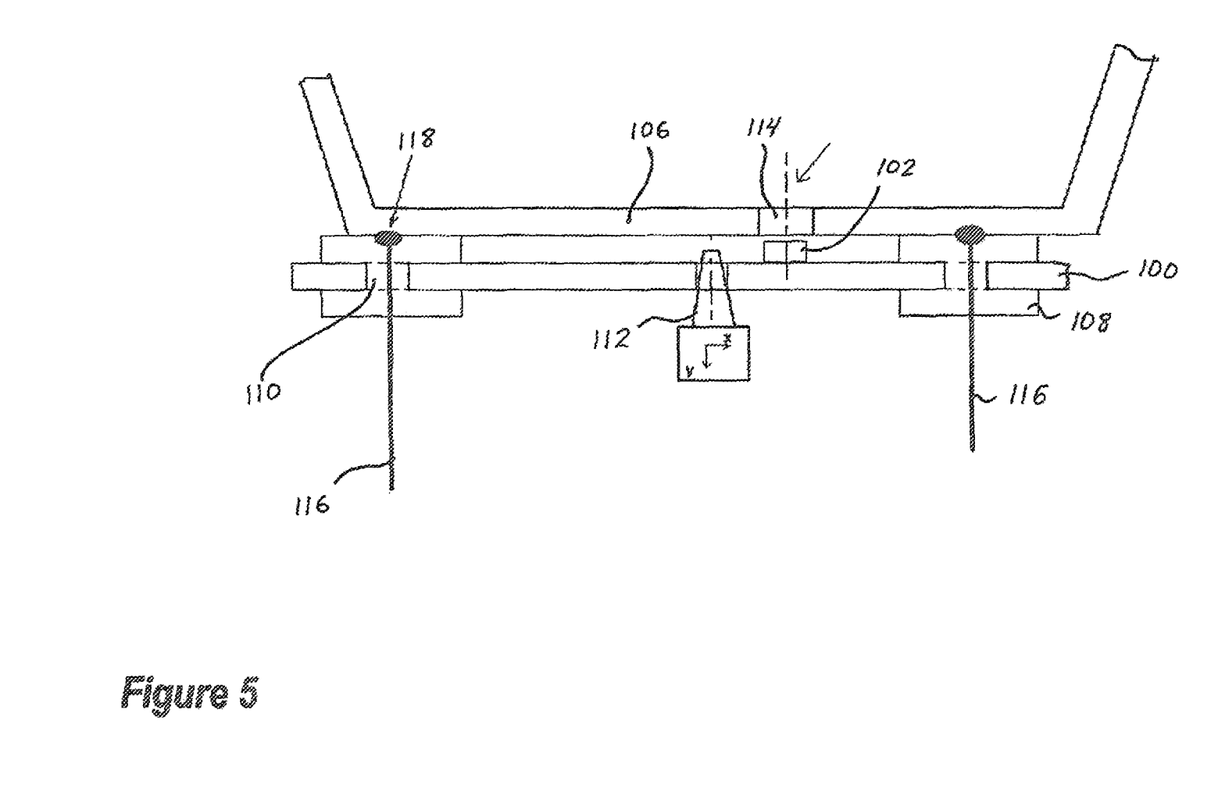
FIG. 5 shows a laser welding step for fixing the aligned structure of FIG. 4.

In FIG. 5, reference numeral 116 symbolizes an applied laser beam, which is directed through the openings 110 which are provided for the welding step. The energy of the laser beam 116 leads to a inching of the material of the housing component 106 and of the distancing elements 108, and thus forms a secure laser welded connection 118. Alternatively, also a hot stamping step, or any other suitable process e.g. gluing, ultrasonic welding or the like, can be performed in order to fix a PCB 100 at the housing component 106 while held in position by a measuring and positioning system.

Figure 6:
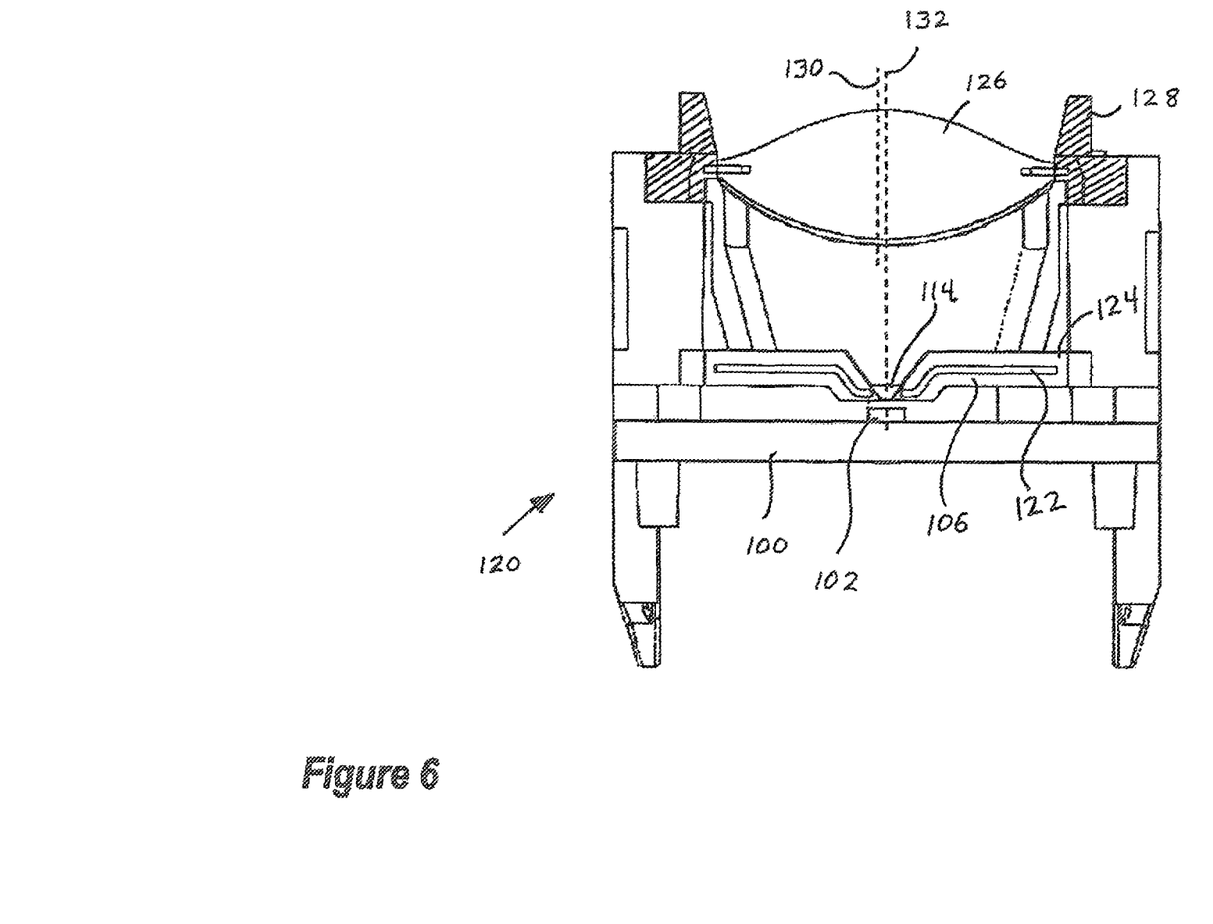
FIG. 6 shows one exemplary optical unit that can be assembled using the alignment method according to one embodiment of the present invention.

FIG. 6 shows an exemplary application of the present alignment method where an optical unit 120 carries the circuit carrier 100, which has to be aligned in view of a housing component 106 which has an aperture 114 for focusing the light emitted from an LED 102.

The alignment between the LED and the aperture 114 can be directly performed by imaging the LED chip 102 through the aperture 114. The fixing between a printed circuit board 100 and the housing component 106 may for instance be established by an overmolding step. Alternatively, of course also a laser welding step can be provided.

Alternatively, the alignment can also be performed with respect to the transparent housing part 128 (shown with a hatching in FIG. 6) in order to align the light emitting centre line 132 with respect to the middle axis 130 of the lens 126. For instance, the lens 126 and the transparent part 128 can be fabricated as one integrated molded part, so that the accuracy of the alignment step will only be influenced by the tooling accuracy.

As shown in FIG. 6, the housing part 128 can fabricated as a two-component molded part in the same molding tool for the lens and the carrier. Such a technique is, for instance, described for forming optical curtains in the European patent application No. 12 166 434.6, "Optical Module and Optical Unit for a Light Curtain, and Fabrication Method". By this integrated two-component technique the tolerance from the lens to the housing component can be minimized and an improved overall positioning accuracy can be achieved. Such an improved positioning accuracy is not only important for larger units such as light curtains, but can also be used advantageously for other sensor applications, such as time of flight (TOF) sensors or optical sensors using a reflective technique. Sensors based in reflective concepts usually have one or more receivers and one or more transmitters integrated therein, and therefore benefit from an improved assembly accuracy between the optical components and parts of the housing, e.g. lenses or apertures.

Figure 7:
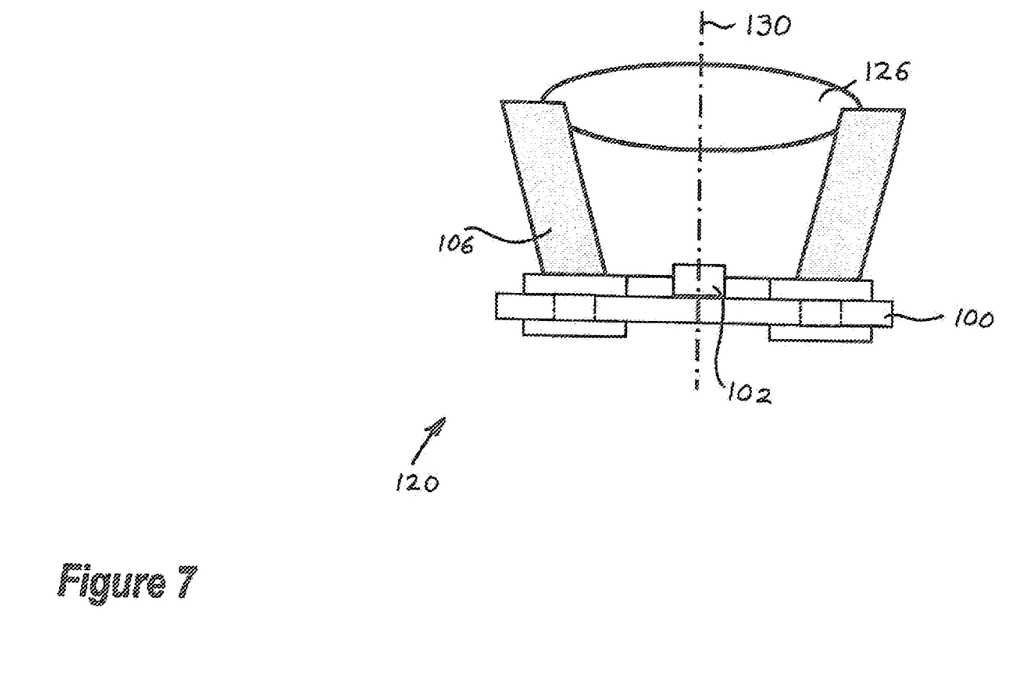
FIG. 7 shows another exemplary optical unit that can be assembled using the alignment method according to one embodiment of the present invention.

Of course, the present invention can also be used for an alignment of an electronic component 102 with respect to a lens 126 without having an aperture at all. Such a system is depicted in FIG. 7. All other features are analogous to what has been explained with respect to the previous figures.

By fabricating the housing component 106 in a way that a metal core 122 is arranged within a plastic outer layer 124, a particularly precise and accurate alignment without the influence of thermal expansion can be maintained after the alignment step.

The advantage of the alignment technique according to the present invention can firstly be seen in the fact that only the COB tolerances influence the alignment and that therefore a much better accuracy can be reached than for example with snap hook applications. The bore holes for welding represent the tolerance window for the laser beam, so that the laser beam does not have not to be exact in its welding position.

When aligning a single LED with respect to an aperture or a lens, all tolerances regarding the mounting of the LED on the PCB can be compensated, including the placement tolerance of the LED within a housing. The resulting tolerance is only influenced by how accurate the optical alignment according to the present invention is performed, and by a possible displacement of the alignment due to the subsequent laser welding or other fixing process. If more than one electronic component is mounted on the circuit carrier, naturally the tolerance of the positioning of the components in respect to each other has an impact on the alignment quality of those components which are not directly used as fiducial. However, the positioning of different components with respect to each other usually has acceptably low tolerances, and is in particular more accurate than the alignment between a fiducial on the print and the electronic component(s). Hence, the alignment according to the present invention also leads to a significant improvement where a plurality of electronic components is involved.

Furthermore, the printed circuit board 100 does not have to be insert molded over big areas, which is difficult for the sealing in the insert molding tool, but only in the small area where the distancing elements 108 are arranged. Hence, no printed circuit board deflection due to thermal influences occurs. The electronic actuator tool 112 can be controlled by a camera and video processing unit that images the position of the electronic component 102 through the aperture 114.

Figure 8:
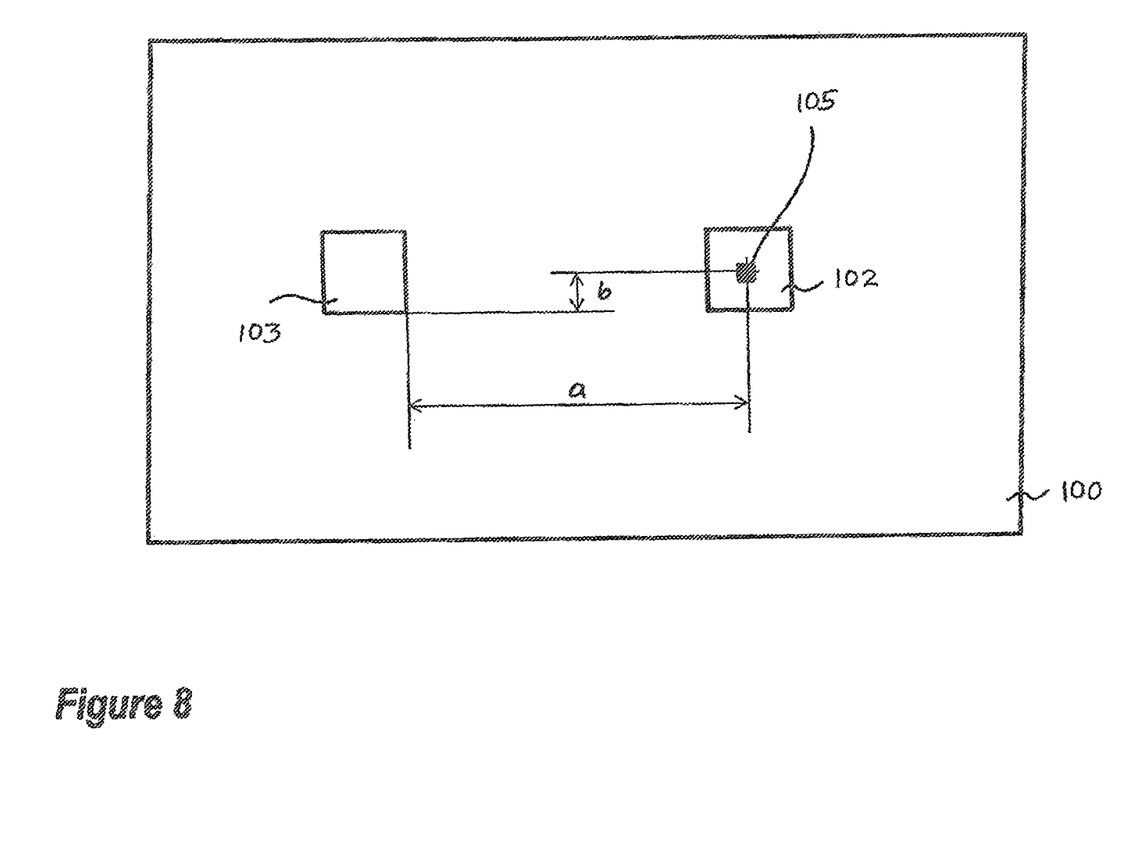
FIG. 8 illustrates the alignment of more than one component using the method according to another embodiment of the present invention.

FIG. 8 illustrates the situation where a first and a second electronic component 102, 103 are mounted on the printed circuit board 100. The first electronic component for instance comprises a receiver integrated circuit with an optically sensitive area 105, wherein the first electronic component 102 is directly used as a fiducial for its own position on the circuit carrier. According to this embodiment, the first electronic component 102 is not only used as a fiducial when aligning the PCB with respect to a mechanical part such as a housing or a lens, but also during the PCB assembly. In particular, the optically sensitive area 105 may be used as a fiducial for the accurate placement of the second electronic component 103 on the printed circuit board 100. For instance when using a COB technique, this alignment of the second electronic component 103 using the already assembled first electronic component 102 can be implemented in a particularly easy way. Hence, the defined distances, a and b, between the first and second electronic components 102, 103 can be observed precisely.

In a next step, the alignment and mounting of the assembled PCB can be performed as described above for a chip with an LED as the first electronic component 102. In particular, the optically sensitive area 105 is again used as a fiducial, now for aligning the PCB with respect to a housing component such as a lens or aperture.

By means of this alignment technique—in particular when combining same with a two-component housing as shown in FIG. 6—a completely new performance level can be achieved for the design of reflective sensors and TOF sensors. For such applications, firstly the highly accurate alignment of two electronic components can be used for the assembly of a transmitter and a receiver on the circuit carrier. Next, the concept of a more-component molded housing (again using one of the transmitter and the receiver as the fiducial) leads to a highly exact alignment of the housing components with respect to the electronic components. This leads to an enhanced radiation yield and sensitivity because the emitted radiation and the sensing areas of the receiver part are correlated to each other much better.

It could be shown that either any structure on a particular electronic component, such as for instance the metal electrodes of an LED, or the edges of a chip (for instance when mounting a TOF component) can be used as a fiducial according to the present invention.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention

TABLE 1

Reference Numerals:

| Reference Numeral | Description |
| --- | --- |
| 100 | circuit carrier |
| 102 | first electronic component |
| 103 | second electronic component |
| 104 | engaging opening |
| 105 | optically sensitive area of a receiver |
| 106 | housing component |
| 108 | distancing elements |
| 110 | opening for welding |
| 112 | tool |
| 114 | aperture |
| 116 | laser beam |
| 118 | laser welded connection |
| 120 | optical unit |
| 122 | metal core |
| 124 | plastic outer layer |
| 126 | lens |
| 128 | transparent part |
| 130 | optical axis of the lens |
| 132 | optical axis of the electronic component/LED |

We claim:

1. A method of assembling a circuit carrier with a housing component, wherein the method comprises the following steps:
providing said circuit carrier, wherein on said circuit carrier there is arranged at least one first electronic component;
providing said housing component having at least one first opening;
aligning said circuit carrier in a way that said electronic component is aligned with respect to said first opening in the housing component, wherein the first electronic component is directly used as a fiducial for its own position on the circuit carrier; and
fixing the circuit carrier at the housing component.

2. The method of claim 1, wherein in the step of aligning the circuit carrier, an optical evaluation of the position of the first electronic component is performed by taking and evaluating images of the electronic component through the first opening.

3. The method of claim 1, wherein said first electronic component is an optoelectronic component which is operable to send and/or receive radiation.

4. The method of claim 1, wherein in the step of fixing the circuit carrier at the housing component, one of a laser welding step, an ultrasonic welding step and a gluing step is performed.

5. The method of claim 4 wherein said circuit carrier comprises at least one second opening and a laser beam is being directed through said second opening for performing the laser welding step.

6. The method of claim 1, wherein, in the step of fixing the circuit carrier at the housing component, a hot stamping step is performed.

7. The method of claim 3, wherein said first opening in the housing component is an optically functional aperture for shaping one of an incident and an emitted radiation beam during operation of the optoelectronic component.

8. The method of claim 1, wherein said first electronic component is assembled on the circuit carrier in a chip-on-board, COB, technique.

9. The method of claim 1, wherein said circuit carrier comprises a metal core printed circuit board, MCPCB.

10. The method of claim 1, further comprising the step of providing at least one distancing element at the circuit carrier for establishing a predefined distance between the housing component and the circuit carrier in a direction across a plane defined by the circuit carrier.

11. The method of claim 1, wherein, during the alignment step, said circuit carrier is moved with respect to the housing component by means of electronically controlled actuators in at least two dimensions.

12. The method of claim 1, further comprising the step of aligning a second electronic component when assembling the second electronic component on said circuit carrier by using the first electronic component as a fiducial for its own position on the circuit carrier.

13. An optical unit comprising an optoelectronic component configured to one of send and receive radiation and a housing element with an aperture for shaping said radiation, wherein the optical unit is assembled using the method according to claim 1.

14. The optical unit of claim 13, wherein said circuit carrier comprises a metal core printed circuit board, MCPCB.

15. The optical unit of claim 14, wherein said metal core comprises an aluminium alloy.

16. The optical unit of claim 13, wherein said housing component comprises an overmolded metal structure.

17. The optical unit of claim 13, wherein said housing component comprises a two-component part integrating at least one transparent lens with an opaque housing.

* * * * *